United States Patent
Lee et al.

(10) Patent No.: US 8,890,251 B2
(45) Date of Patent: Nov. 18, 2014

(54) SEMICONDUCTOR DEVICE AND METHOD OF MANUFACTURING THE SAME

(75) Inventors: Ki Hong Lee, Gyeonggi-do (KR); Seung Ho Pyi, Gyeonggi-do (KR); Il Young Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/598,604

(22) Filed: Aug. 29, 2012

(65) Prior Publication Data
US 2013/0240994 A1    Sep. 19, 2013

(30) Foreign Application Priority Data
Mar. 13, 2012  (KR) .................. 10-2012-0025499

(51) Int. Cl.
*H01L 29/40* (2006.01)

(52) U.S. Cl.
USPC .................................. 257/364; 257/E29.134

(58) Field of Classification Search
CPC .............. H01L 29/4933; H01L 29/42376; H01L 27/2481; H01L 27/1128
USPC .......................................... 257/364; 438/592
See application file for complete search history.

(56) References Cited

U.S. PATENT DOCUMENTS

| | | | |
|---|---|---|---|
| 2002/0022355 A1* | 2/2002 | Kim .............................. | 438/586 |
| 2005/0017362 A1* | 1/2005 | Erickson et al. .............. | 257/758 |
| 2006/0081906 A1* | 4/2006 | Jeong ............................ | 257/314 |
| 2007/0049015 A1* | 3/2007 | Nejad et al. ................... | 438/649 |
| 2009/0001582 A1* | 1/2009 | Han et al. ...................... | 257/751 |
| 2010/0207201 A1* | 8/2010 | Masuoka et al. .............. | 257/329 |
| 2010/0219483 A1* | 9/2010 | Masuoka et al. .............. | 257/369 |
| 2011/0014763 A1* | 1/2011 | Sreekantham et al. ....... | 438/270 |
| 2011/0032786 A1* | 2/2011 | Yang et al. ............... | 365/230.06 |
| 2011/0045666 A1* | 2/2011 | Whang et al. ................. | 438/587 |
| 2012/0037918 A1* | 2/2012 | Miyazaki et al. ............... | 257/76 |
| 2012/0049252 A1* | 3/2012 | Masuoka et al. .............. | 257/288 |
| 2012/0289039 A1* | 11/2012 | Kajiwara ...................... | 438/588 |
| 2013/0056836 A1* | 3/2013 | Yu et al. ........................ | 257/410 |
| 2013/0140627 A1* | 6/2013 | Masuoka et al. .............. | 257/329 |
| 2013/0148400 A1* | 6/2013 | Murooka ....................... | 365/63 |

FOREIGN PATENT DOCUMENTS

KR    1020130044713    5/2013

* cited by examiner

*Primary Examiner* — Ahmed Sefer

(74) *Attorney, Agent, or Firm* — IP & T Group LLP

(57) ABSTRACT

A semiconductor device includes a substrate, and a gate line, located over the substrate, which includes a first conductive layer and one or more second conductive pattern layers located in the first conductive layer. The second conductive pattern layer comprises a metal layer to thus reduce resistance of a gate line.

19 Claims, 12 Drawing Sheets

CELL
I - I'

PERI
I - I'

CELL
I - I'

CELL
II - II'

PERI
I - I'

CELL
I - I'

CELL
II - II'

PERI
I - I'

CELL
I – I'

CELL
II – II'

PERI
I – I'

SEMICONDUCTOR DEVICE AND METHOD OF MANUFACTURING THE SAME

CROSS-REFERENCE TO RELATED APPLICATION

Priority is claimed to Korean patent application number 10-2012-0025499 filed on Mar. 13, 2012, the entire disclosure of which is incorporated herein by reference in its entirety.

BACKGROUND

1. Field of Invention

Embodiments of the present invention relate to a semiconductor device and a method of manufacturing the same and, more particularly, to a semiconductor device including a gate line and a method of manufacturing the same.

2. Description of Related Art

A non-volatile memory device can retain data stored therein even without power supply. A non-volatile memory device is configured to store data in a plurality of memory cells formed in a cell region and drive the memory cells by using a plurality of driving transistors formed in a peripheral region.

Here, these driving transistors may include a gate insulating layer and a gate electrode that are formed over a substrate. In general, the driving transistors are formed using the same processes as the memory cells. The gate electrode is formed of a polysilicon layer. Therefore, the gate electrode may have high resistance.

BRIEF SUMMARY

An embodiment of the present invention relates to a semiconductor device reducing resistance of a gate line and a method of manufacturing the same.

A semiconductor device according to an embodiment of the present invention includes a substrate, and a gate line, located over the substrate, which includes a first conductive layer and one or more second conductive pattern layers located in the first conductive layer.

A semiconductor device according to another embodiment of the present invention includes a pipe gate, located in a cell region, including a first conductive layer, and a gate line, located in a peripheral region and including the first conductive layer and one or more second conductive pattern layers located in the first conductive layer.

A method of manufacturing a semiconductor device according to yet another embodiment of the present invention includes forming a gate insulating layer on a substrate, and forming a gate line over the gate insulating layer, wherein the gate line includes a first conductive layer and one or more second conductive pattern layers which are formed in the first conductive layer.

DESCRIPTION OF EMBODIMENTS

Figure 1A:
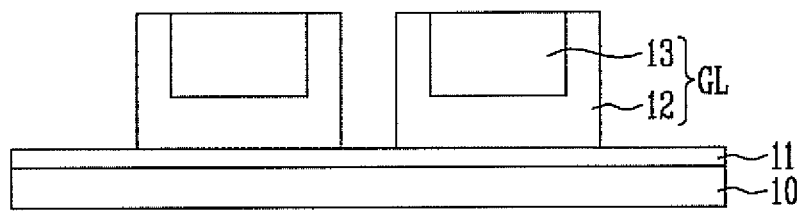
FIGS. 1A to 1D are cross-sectional views of gate lines of semiconductor devices according to first to fourth embodiments of the present invention.

Hereinafter, various embodiments of the present disclosure will be described in detail with reference to the accompanying drawings. The figures are provided to enable those of ordinary skill in the art to make and use the present invention according to the embodiments of the present invention.

FIGS. 1A to 1D are cross-sectional views of gate lines of semiconductor devices according to first to fourth embodiments of the present invention.

As shown in FIGS. 1A to 1D, a semiconductor device may include a gate insulating layer 11 that is formed in a peripheral region of a substrate 10 and gate lines GL that are formed over the gate insulating layer 11. Each of the gate lines GL may include a first conductive layer 12 and a second conductive pattern layer 13 formed in the first conductive layer 12. Here, the second conductive pattern layer 13 may be a line pattern or an island pattern.

For example, after the gate insulating layer 11 is formed on the substrate 10, the first conductive layer 12 may be formed over the gate insulating layer 11. Subsequently, the first conductive layers 12 may be etched to form trenches. A second conductive layer may be formed on the first conductive layer 12 where the trenches are formed. Subsequently, a planarization process may be performed until a surface of the first conductive layer 12 is exposed, thus forming the second conductive pattern layers 13 to fill the trenches. Subsequently, the first conductive layer 12 may be patterned to form the gate lines GL.

As shown in FIG. 1A, each of the gate lines GL according to the first embodiment may include the first conductive layer 12 and the second conductive pattern layer 13 formed in the first conductive layer 12. The first conductive layer 12 may contact with a bottom surface and side surfaces of the second conductive pattern layer 13.

The first conductive layer 12 and the second conductive pattern layer 13 may be formed of different materials. The second conductive pattern layer 13 may be formed of a material having a resistance lower than that of the first conductive layer 12. For example, the first conductive layer 12 may comprise a polysilicon layer. The second conductive pattern layer 13 may comprise a metal layer such as a tungsten layer or a titanium nitride layer.

In addition, the second conductive pattern layer 13 may comprise a single metal layer or a multilayer including a plurality of metal layers that are stacked.

Figure 1B:
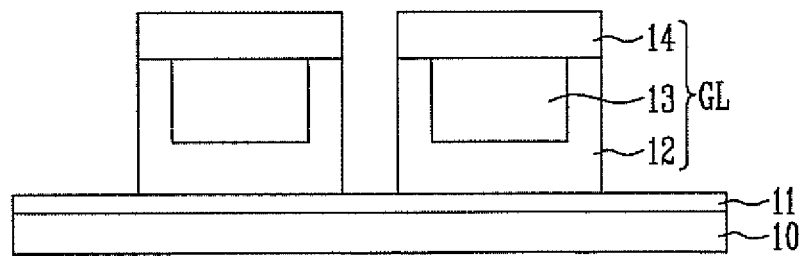

As shown in FIG. 1B, each of the gate lines GL according to the second embodiment may include the first conductive layer 12, the second conductive pattern layer 13 formed in the first conductive layer 12. A third conductive layer 14 formed over the first conductive layer 12. Here, the first conductive layer 12 may contact with a bottom surface and side surfaces of the second conductive pattern layer 13. The third conductive layer 14 may contact with a top surface of the second conductive pattern layer 13.

The third conductive layer 14 and the first conductive layer 12 may be formed of the same material or different materials. For example, when the third conductive layer 14 and the first conductive layer 12 are formed of the same material, the first conductive layer 12 and the third conductive layer 14 may comprise a polysilicon layer respectively.

In addition, the third conductive layer 14 and the first conductive layer 12 may include the same type of impurities or different types of impurities. In one example, both the third conductive layer 14 and the first conductive layer 12 may include either P type impurities or N type impurities. In another example, the first conductive layer 12 may include N type impurities. The third conductive layer 14 may include P type impurities.

Figure 1C:
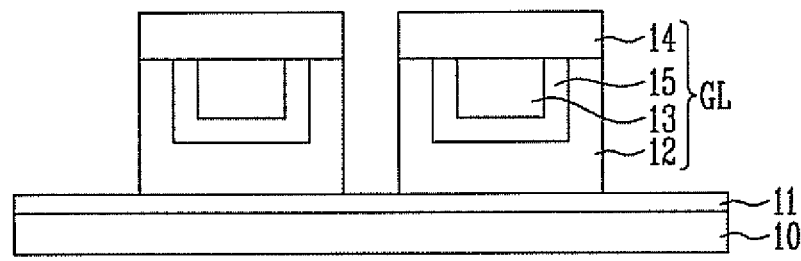

As shown in FIG. 1C, each of the gate lines GL according to the third embodiment may include the first conductive layer 12, the second conductive pattern layer 13 formed in the first conductive layer 12, a barrier pattern layer 15 that surrounds a bottom surface and side surfaces of the second conductive pattern layer 13, and the third conductive layer 14 formed over the first conductive layer 12. Here, the third conductive layer 14 may contact with a top surface of the second conductive pattern layer 13.

The barrier pattern layer 15 and the second conductive pattern layer 13 may be formed of the same material or different materials. For example, the barrier pattern layer 15 may be formed of a metal layer such as a titanium nitride layer. The second conductive pattern layer 13 may be formed of a conductive layer, such as tungsten.

Figure 1D:
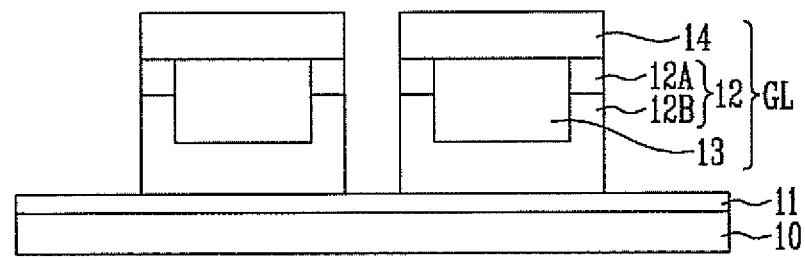

As shown in FIG. 1D, each of the gate lines GL according to the fourth embodiment may include the first conductive layer 12 (i.e., 12A and 12B), the second conductive pattern layer 13 formed in the first conductive layer 12, and the third conductive layer 14 formed over the first conductive layer 12. Here, the first conductive layer 12 may be a multilayer including a stack structure of plural material layers. The plural material layers may be doped with different types of impurities.

The first conductive layer 12 may comprise an upper first conductive layer 12A and a lower first conductive layer 12B. The upper first conductive layer 12A and the lower first conductive layer 12B may include different types of impurities. For example, the lower first conductive layer 12B may include N type impurities. The upper first conductive layer 12A may include P type impurities.

In addition, the upper first conductive layer 12A and the third conductive layer 14 may include the same type impurities or different types of impurities. For example, both the upper first conductive layer 12A and the third conductive layer 14 both may include P type impurities.

The second conductive pattern layer 13 may contact with both upper and lower first conductive layers 12A and 12B or with the upper first conductive layer 12A, which may be determined according to the depth of a trench. In FIG. 1D, when the first conductive layer 12 is etched to form trenches, a portion of each of the lower first conductive layers 12B may be etched by a predetermined depth. Accordingly, the lower first conductive layer 12B may contact with a bottom surface and lower side surfaces of the second conductive pattern layer 13. The upper first conductive layer 12A may contact with upper side surfaces of the second conductive pattern layer 13.

According to the structure as described above, the gate line GL may be formed of different materials. In particular, resistance of the gate line GL may be reduced because the second conductive pattern layer 13 having a second resistance is formed in the first conductive layer 12 having a first resistance greater than the second resistance. In addition, even when a depletion region is formed at the interface between the first conductive layer 12 and the third conductive layer 14, the second conductive pattern layer 13 may couple the first conductive layer 12 and the third conductive layer 14 to each other because the first conductive layer 12 and the third conductive layer 14 are doped with different types of impurities.

FIGS. 2A to 2D are cross-sectional views of gate lines of semiconductor devices according to fifth to eighth embodiments of the present invention.

The gate lines according to the fifth to eighth embodiments may have a similar structure to the gate lines according to the first to fourth embodiments except for the shape of second conductive pattern layers 23. Thus, a description of the contents of the fifth to eighth embodiments the same as those of the first to fourth embodiments is omitted.

Figure 2A:
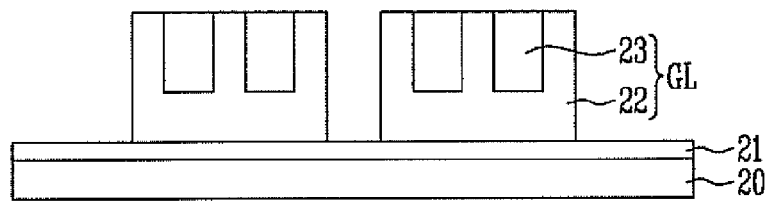
FIGS. 2A to 2D are cross-sectional views of gate lines of semiconductor devices according to fifth to eighth embodiments of the present invention.

As shown in FIG. 2A, the semiconductor device according to the fifth embodiment may include a gate insulating layer 21 that is formed in a peripheral region of a substrate 20 and gate lines GL that are formed over the gate insulating layer 21. Each of the gate lines GL may include a first conductive layer 22 and the second conductive pattern layers 23 formed in the first conductive layer 22. Here, the second conductive pattern layer 23 may include at least one line pattern, at least one island pattern, or a combination of a line pattern and an island pattern.

Figure 2B:
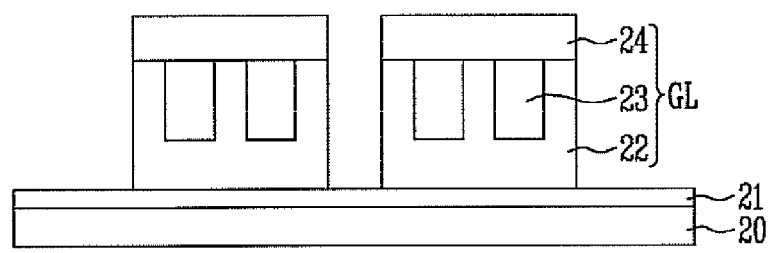

As shown in FIG. 2B, each of the gate lines GL of the semiconductor device according to the sixth embodiment may further include a third conductive layer 24. The third conductive layer 24 and the first conductive layer 22 may include the same type of impurities. Otherwise, the third conductive layer 24 and the first conductive layer 22 may include different types of impurities.

Figure 2C:
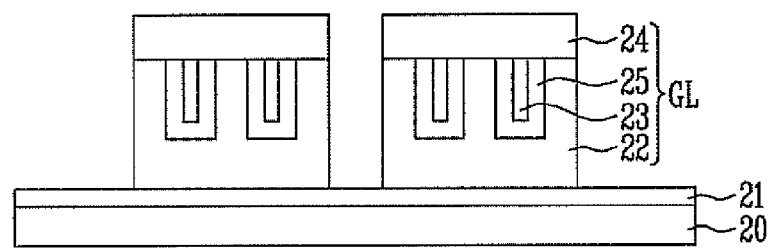

As shown in FIG. 2C, each of the gate lines GL of the semiconductor device according to the seventh embodiment of the present invention may further include barrier pattern layers 25, each contacted with a bottom surface and side surfaces of the second conductive pattern layer 23.

Figure 2D:
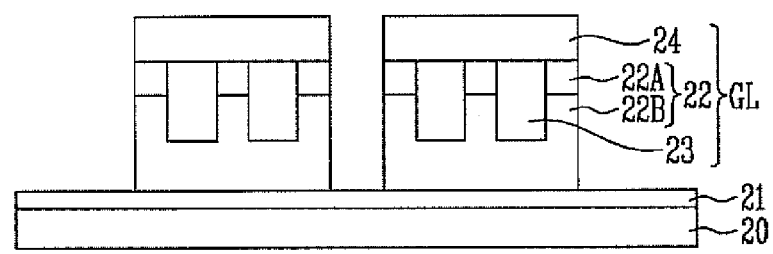

As shown in FIG. 2D, each of the gate lines GL of the semiconductor device according to the eighth embodiment may include the first conductive layer 22 that comprises a multilayer. Here, the first conductive layer 22 may comprise an upper first conductive layer 22A and a lower first conductive layer 22B. In addition, the second conductive pattern layers 23 may contact with the upper first conductive layer 22A or both upper and lower first conductive layers 22A and 22B.

Figure 3A:
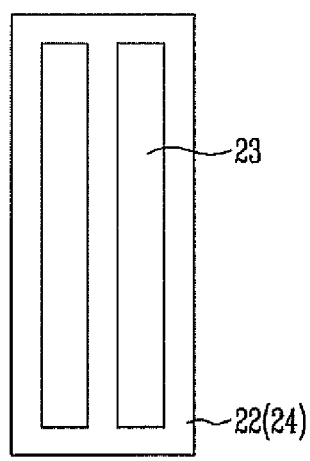
FIGS. 3A to 3C are plan views of the gate lines of the semiconductor devices according to the fifth to eighth embodiments of the present invention.
Figure 3B:
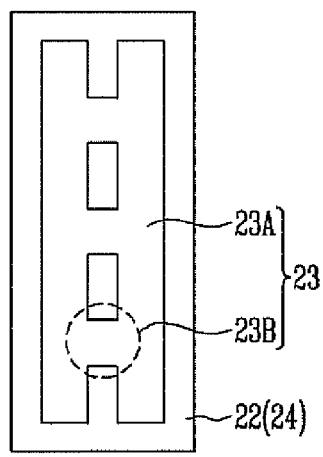
Figure 3C:
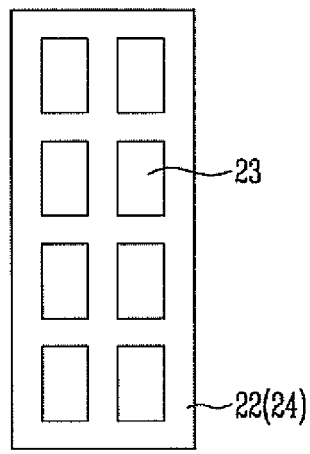

FIGS. 3A to 3C are plan views of the gate lines of the semiconductor devices according to the fifth to eighth embodiments of the present invention.

As shown in FIG. 3A, the second conductive pattern layers 23 may be one or more line patterns that extend in one direction. Here, the line patterns may extend in parallel or in a direction the same as a direction in which the gate lines GL extend. Alternatively, the line patterns may extend at a predetermined angle with respect to the gate lines GL.

As shown in FIG. 3B, the second conductive pattern layer 23 may include line patterns 23A, which extend in a predetermined direction, and island patterns 23B which are located between the line patterns 23A and coupled to the line patterns 23A to each other. In this case, the second conductive pattern layer 23 may have a ladder shape.

As shown in FIG. 3C, the second conductive pattern layers 23 may be one or more island patterns.

The second conductive pattern layer 23 may have various shapes in addition to the shapes illustrated in FIGS. 3A to 3C. For example, the second conductive pattern layer 23 may have a combination of a line pattern and an island pattern. An island pattern may have various shapes including a circular shape, an elliptical shape and a triangular shape in addition to a rectangular shape.

Figure 4A:
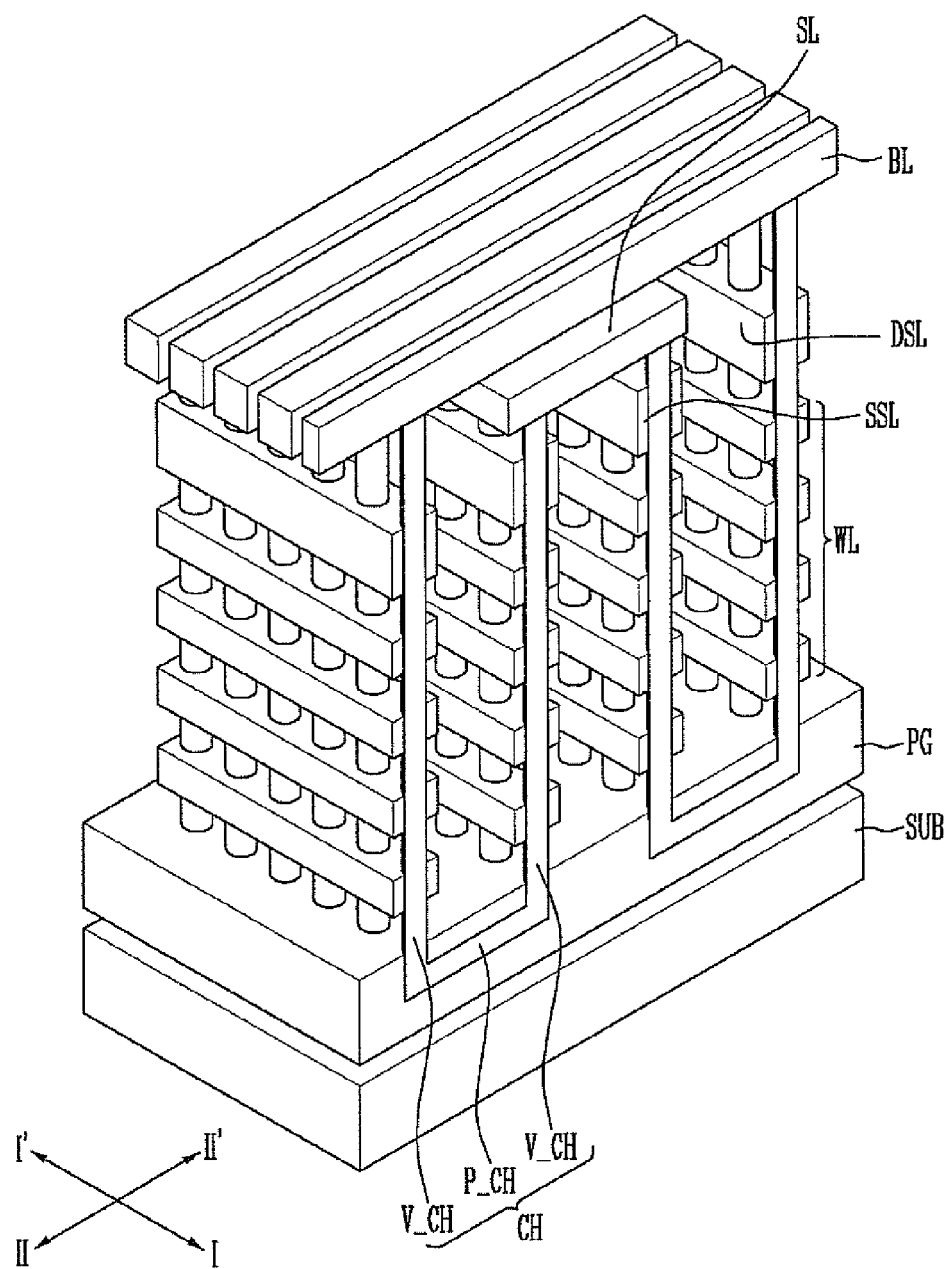
FIGS. 4A to 4C are views of the structure of a three-dimensional (3-D) non-volatile memory device according to an embodiment of the present invention.
Figure 4B:
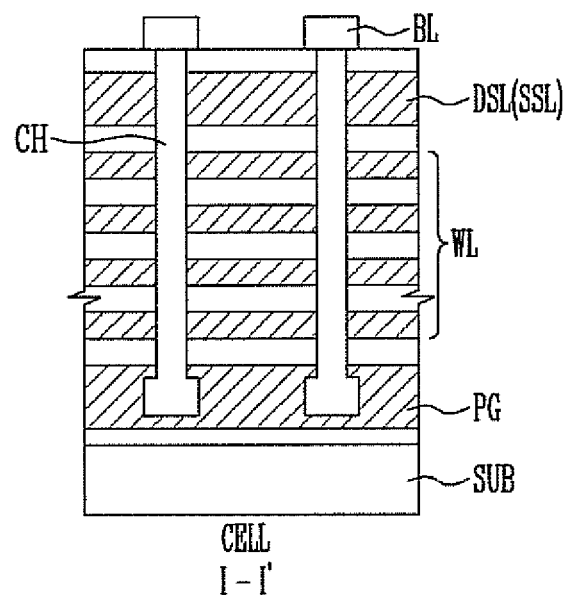
Figure 4C:
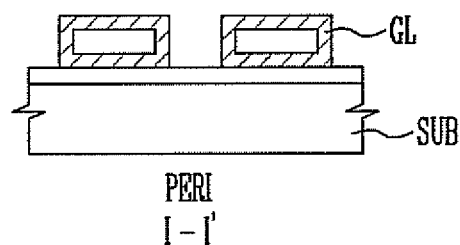

FIGS. 4A to 4C are views illustrating the structure of a three-dimensional (3-D) non-volatile memory device according to an embodiment of the present invention.

FIG. 4A is a perspective view illustrating the structure of a 3-D non-volatile memory device according to an embodiment of the present invention. For illustration purposes, a cell region is mainly depicted, but interlayer insulating layers are not depicted.

As shown in FIG. 4A, a 3-D non-volatile memory device according to an embodiment of the present invention may include channel layers CH that are arranged in a first direction I-I' and a second direction II-II'. Here, each of the channel layers CH may include a pipe channel layer P_CH that is formed in a pipe gate PG and vertical channel layers V_CH that are coupled to the pipe channel layer P_CH. Here, each of the channel layers CH may have at least two vertical channel layers V_CH coupled to the pipe channel layer P_CH. The channel layer CH may have a U-shape or a W-shape according to the number of vertical channel layers V_CH coupled to the pipe channel layer P_CH.

In addition, the 3D non-volatile memory device may include a plurality of word lines WL that are stacked along the vertical channel layers V_CH. At least one layer of source select lines SSL and at least one layer of drain select lines DSL may be stacked over the word lines WL. A source line SL extending in the second direction II-II' may be provided over the source select lines SSL. Bit lines BL extending in the first direction I-I' may be provided over the source line SL.

According to the above-described structure, a plurality of strings, each including at least one source select transistor, plural memory cells and at least one drain select transistor, may be arranged in three dimensions.

FIGS. 4B and 4C are cross-sectional views in the first direction I-I' of the semiconductor device according to the embodiment of the present invention. FIG. 4B illustrates a cell region. FIG. 4C illustrates a peripheral region.

As shown in FIGS. 4B and 4C, a plurality of strings may be arranged in a cell region. A plurality of driving transistors configured to drive the memory cells stacked in the cell region may be provided in the peripheral region. Here, the pipe gate PG in the cell region and the gate lines GL in the peripheral region may be formed by the same processes using the same material layers.

FIGS. 5A to 5C, 6A to 6C, and 7A to 7C are cross-sectional views illustrating a method of manufacturing a 3-D non-volatile memory device according to an embodiment of the present invention. FIGS. 5A to 5C, 6A to 6C, and 7A to 7C are cross-sectional views illustrating a method of forming the gate lines according to the first to eighth embodiments of the present invention, FIGS. 5A to 7A are cross-sectional views in the direction I-I' of a cell region. FIGS. 5B to 7B are cross-sectional views in the direction II-II' of the cell region. FIGS. 5C to 7C are cross-sectional views in the direction I-I' of a peripheral region.

Figure 5A:
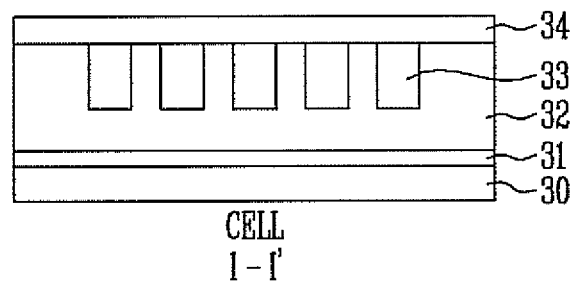
FIGS. 5A to 5C, 6A to 6C and 7A to 7C are cross-sectional views illustrating the process flow of a method of manufacturing a 3-D non-volatile memory device according to another embodiment of the present invention.
Figure 5B:
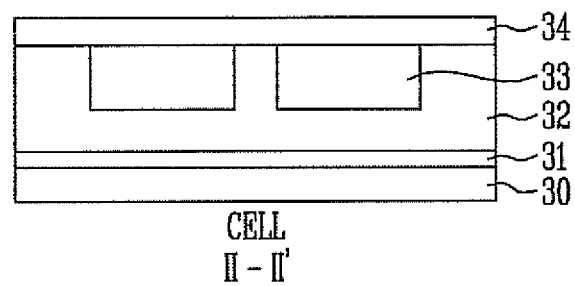
Figure 5C:
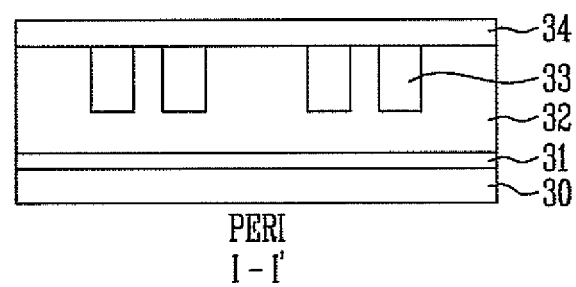

As shown in FIGS. 5A to 5C, after an insulating layer 31 is formed over a substrate 30, a first conductive layer 32 may be formed over an insulating layer 31. Here, the first conductive layer 32 may be provided to form a pipe gate in a cell region and gate lines in a peripheral region. The first conductive layer 32 may comprise a single layer or a multilayer. For example, the first conductive layer 32 may comprise a polysilicon layer including N type impurities. Otherwise, the first conductive layer 32 may comprise a multilayer including a lower first conductive layer of N type impurities and an upper first conductive layer of P type impurities.

Subsequently, the first conductive layer 32 may be etched to form first trenches in the peripheral region and second trenches in the cell region. The first and second trenches may be line type trenches, island type trenches, or a combination of line type trenches and island type trenches.

In addition, the first trenches and the second trenches may have the same or different widths and the same or different depths. For example, each of the first trenches may have a width greater than a width of each of the second trenches. Each of the first trenches may have the same depth as each of the second trenches.

Subsequently, a second conductive layer may be formed over the first conductive layer 32 to fill the first and second trenches. A planarization process may be performed to expose a surface of the first conductive layer 32. In this manner, second conductive pattern layers 33 may be formed in the first and second trenches.

Here, the second conductive pattern layer 33 formed in the cell region may be used as a sacrificial layer to ensure a region in which a pipe channel layer is formed. The second conductive pattern layer 33 formed in the peripheral region may be used as a portion of a gate line.

Subsequently, a third conductive layer 34 may be formed over the first conductive layer 32 with the second conductive pattern layers 33. Here, the third conductive layer 34 may be formed of the same material or different materials from the first conductive layer 32. Also, the third conductive layer 34 and the first conductive layer 32 may include impurities of the same type or different types. For reference, the process of forming the third conductive layer 34 may be omitted.

Figure 6A:
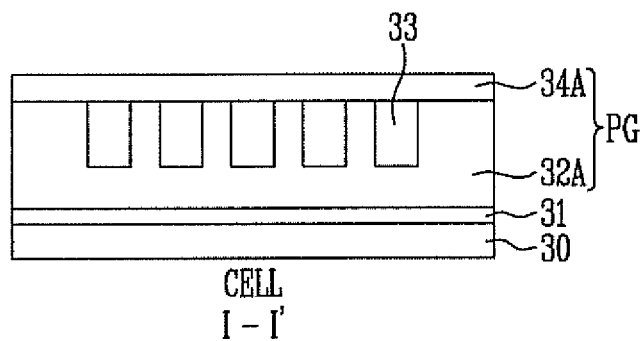
Figure 6B:
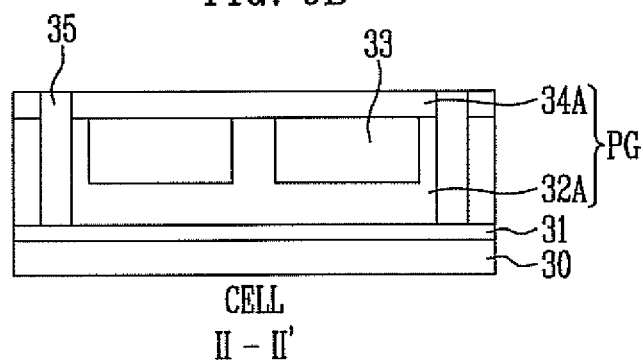
Figure 6C:
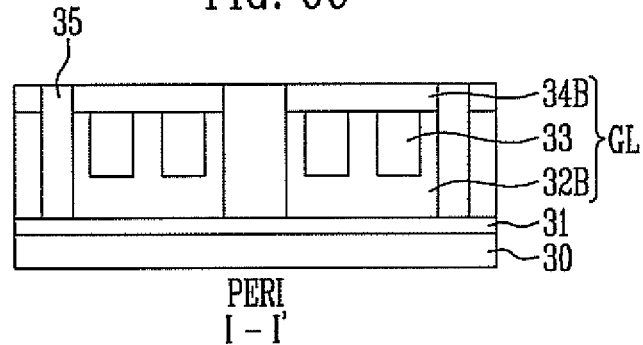

As shown in FIGS. 6A to 6C, the third conductive layer 34 and the first conductive layer 32 may be etched. Here, the third conductive layer 34 and the first conductive layer 32 between adjacent trenches may be etched such that the second conductive pattern layers 33 are included in the first conductive layer 32.

As a result, the pipe gate PG may be formed of a first conductive layer 32A, the second conductive pattern layers 33, and a third conductive layer 34A in the cell region. The gate line GL may be formed of a first conductive layer 32B, the second conductive pattern layers 33, and a third conductive layer 34B in the peripheral region.

Subsequently, insulating layers 35 may be formed in regions removed from by etching the third conductive layer 34 and the first conductive layer 32B.

Figure 7A:
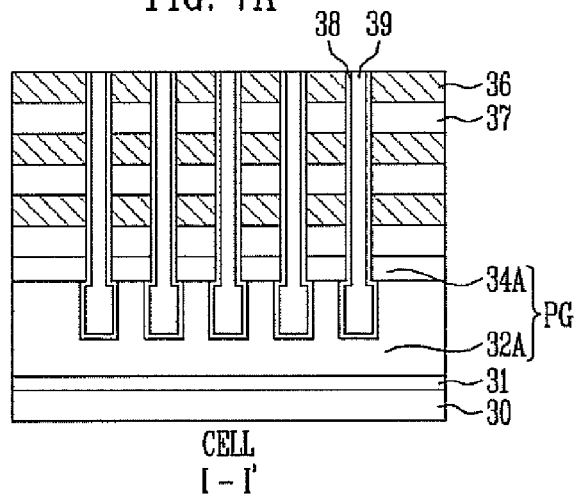
Figure 7B:
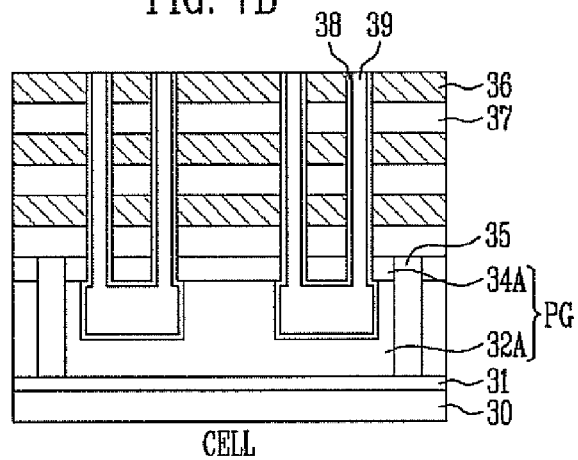
Figure 7C:
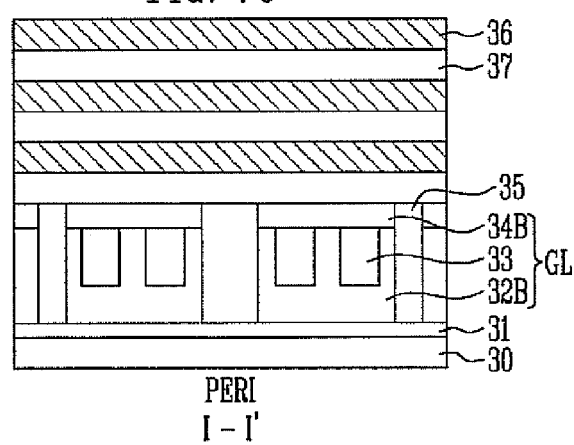

As shown in FIGS. 7A to 7C, first material layers 36 and second material layers 37 may be formed alternately over the resultant structure that has the pipe gate PG and the gate lines GL.

Here, the first material layers 36 may be provided to form conductive layers such as word lines, source select lines and drain select lines. The second material layers 37 may be provided to form interlayer insulating layers that separate the stacked conductive layers from each other.

The first material layer 36 and the second material layer 37 may have a high etch selectivity therebetween. In one example, the first material layer 36 may comprise a conductive layer such as a polysilicon layer. The second material layer 37 may comprise an insulating layer such as an oxide layer. In another example, the first material layer 36 may comprise a conductive layer such as a doped polysilicon layer or a doped amorphous silicon layer. The second material layer 37 may comprise a sacrificial layer such as an undoped polysilicon layer or an undoped amorphous silicon layer. In yet another example, the first material layer 36 may comprise a sacrificial layer such as a nitride layer. The second material layer 37 may comprise an insulating layer such as an oxide layer.

Subsequently, processes of forming memory cells in the cell region may be performed. Here, these processes may be performed only in the cell region.

First, the first material layers 36 and the second material layers 37 that are stacked may be etched to form channel holes that are coupled to the second trenches. Subsequently, the second conductive pattern layers 33 exposed at bottom surfaces of the channel holes may be removed.

Subsequently, channel layers 38 may be formed along inner surfaces of the second trenches and the channel holes coupled to the second trenches. Each of the channel layers 38 may completely fill the second trench and the channel holes or have an open central region. Here, the open central region of the channel layer 38 may be filled with an insulating layer 39.

For reference, before the channel layers 38 are formed, memory layers may be formed along the inner surfaces of the second trenches and the channel holes coupled to the second trenches. Here, each of the memory layers may comprise a charge blocking layer, a charge trap layer, and a tunnel insulating layer. The memory layer may comprise a charge trap layer and a tunnel insulating layer with the exception of a charge blocking layer. Otherwise, the memory layer may comprise a buffer layer, a charge trap layer, and a tunnel insulating layer. In another example, the memory layer may be formed of a buffer layer, a charge blocking layer, a charge trap layer, and tunnel insulating layer. For example, the charge blocking layer may comprise an oxide layer such as an aluminum oxide layer ($Al_2O_3$). In another example, the charge blocking layer may be formed by stacking oxide layers such as a silicon oxide layer ($SiO_2$) and an aluminum oxide layer. In this case, after the aluminum oxide layer may be formed along the inner surface of the channel hole, the silicon oxide layer may be formed over the aluminum oxide layer.

Subsequently, though not shown in FIGS. 7A to 7C, the first material layers 36 and the second material layers 37 may be etched to form slits (not shown) between the channel holes. The slits may be filled with insulating layers. As a result, memory cells may be stacked along the vertical channel layers. Here, additional processes may be performed before the slits are filled with the insulating layers, depending on the materials of the first material layers 36 and the second material layers 37.

In one example, when the first material layer 36 comprises a conductive layer and the second material layer 37 comprises an insulating layer, the first material layers 36 exposed through the slits may be silicided. The slits may subsequently be filled with the insulating layers.

In another example, when the first material layer 36 comprises a conductive layer and the second material layer 37 comprises a sacrificial layer, the second material layers 37 exposed through the slits may be removed. Subsequently, the slits and regions from which the second material layers 37 are removed may be filled with the insulating layers.

In yet another example, when the first material layer 36 comprises a sacrificial layer and the second material layer 37 comprises an insulating layer, the first material layers 36 exposed through the slits may be removed. Subsequently, regions from which the first material layers 36 are removed may be filled with conductive layers such as tungsten (W) to thus form word lines, source select lines, or drain select lines The slits may subsequently be filled with the insulating layers.

For reference, when charge blocking layers are not formed in the channel holes, the charge blocking layers may be formed along inner surfaces of regions where the first material layers 36 are removed before the regions are filled with the conductive layers. When a charge blocking layer that is formed of an oxide is formed in each of the channel holes, each channel hole may be filled with a conductive layer after an aluminum oxide layer is additionally formed. When a buffer layer, a charge trap layer, and a tunnel insulating layer are formed in each of the channel holes, the charge blocking layer may be formed by etching the buffer layer to expose the charge trap layer. Here, the charge blocking layer may comprise an aluminum oxide layer or a stacked structure of a silicon oxide layer and an aluminum oxide layer. When a buffer layer, a charge blocking layer, a charge trap layer, and a tunnel insulating layer are formed in each of the channel holes, each channel hole may be filled with a conductive layer by etching the buffer layer to expose the charge blocking layer.

According to the embodiment of the present invention, the pipe gate PG in the cell region and the gate lines GL in the peripheral region may be formed at the same time. In particular, since the sacrificial layer that fills the trench of the pipe gate PG is used as the second conductive pattern layer 33 of the gate line GL, the gate line GL including the second conductive pattern layers 33 may be used without performing additional processes.

FIGS. 8A to 8C, 9A to 9C, and 10A to 10C are cross-sectional views illustrating the process flow of a method of manufacturing a 3-D non-volatile memory device according to another embodiment of the present invention. FIGS. 8A to 8C, 9A to 9C and 10A to 10C are cross-sectional views illustrating the process flow of a method of forming the gate lines according to the first to eighth embodiments as described above. FIGS. 8A to 10A are cross-sectional views in the direction I-I' of a cell region. FIGS. 8B to 10B are cross-sectional views in the direction II-II' of the cell region. FIGS. 8C to 10C cross-sectional views in the direction I-I' of a peripheral region.

Hereinafter, a description of the contents the same as those described in connection with FIGS. 5A to 5C, 6A to 6C, and 7A to 7C is omitted.

Figure 8A:
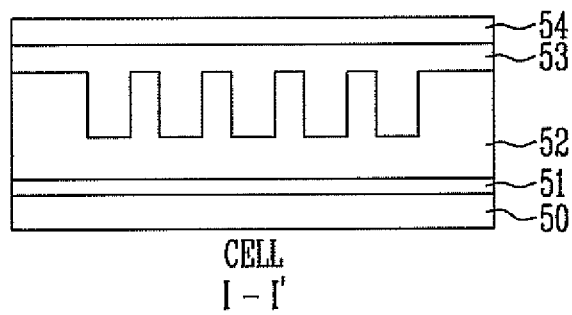
FIGS. 8A to 8C, 9A to 9C and 10A to 10C are cross-sectional views illustrating the process flow of a method of manufacturing a 3-D non-volatile memory device according to another embodiment of the present invention.
Figure 8B:
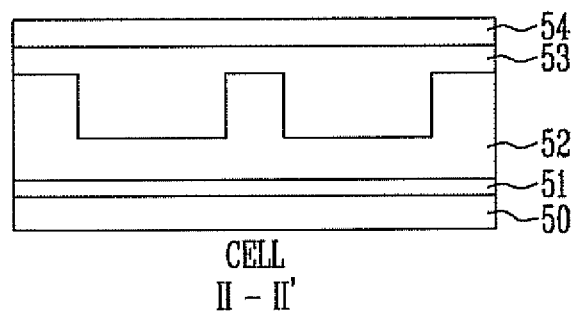
Figure 8C:
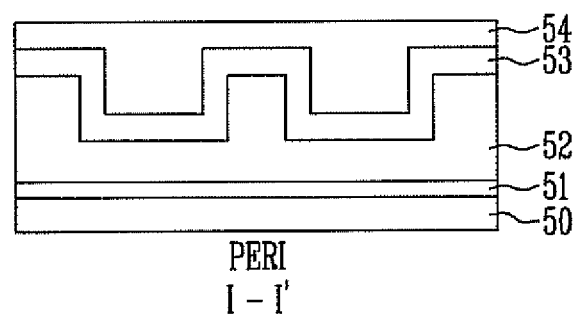

As shown in FIG. 8A to 8C, after an insulating layer 51 and a first conductive layer 52 are formed over a substrate 50, the first conductive layer 52 may be etched to form first and second trenches.

Subsequently, a barrier layer 53 may be formed over an entire surface of the first conductive layer 52 in which the first and second trenches are formed. Here, the barrier layer 53 may have a thickness such that the barrier layer 53 may completely fill the second trenches in the cell region and open central regions of the first trenches in the peripheral region.

Here, the barrier layer 53 formed in the cell region may be used as a sacrificial layer. The barrier layer 53 formed in the peripheral region may be used as a portion of a gate line. For example, the barrier layer 53 may comprise a metal layer such as a titanium nitride layer.

Subsequently, a second conductive layer 54 may be formed over the first conductive layer to completely fill the central regions of the first trenches including the barrier layer 53. Here, the second conductive layer 54 may comprise a conductive layer such as tungsten.

Here, when the first trench has a width smaller than or equal to the second trench, or the first trench has a depth smaller than or equal to the second trench, both first trench and second trench may be completely filled with the barrier layer 53. In this case, the process of forming the second conductive layer 54 may be omitted.

Figure 9A:
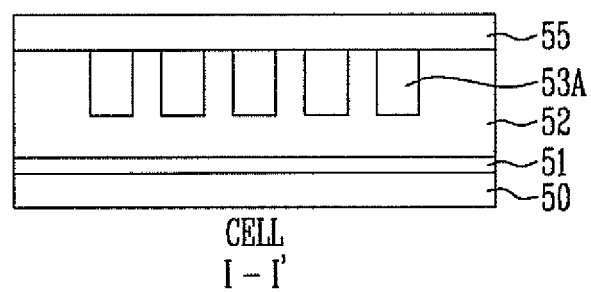
Figure 9B:
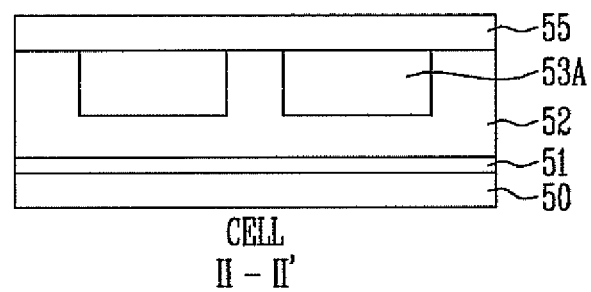
Figure 9C:
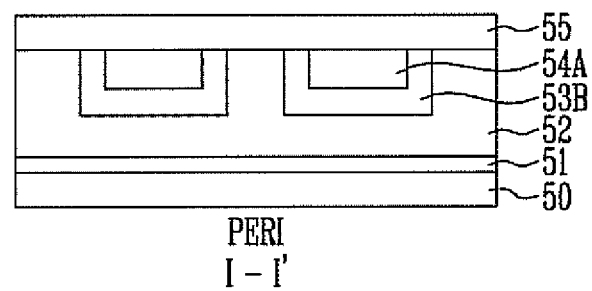

As shown in FIGS. 9A to 9C, a planarization process may be performed until a surface of the first conductive layer 52 is exposed. As a result, the second trenches may be filled with barrier pattern layers 53A. The first trenches may be filled with barrier pattern layers 53B and second conductive pattern layers 54A.

Subsequently, a third conductive layer 55 may be formed over the first conductive layer 52 with the barrier pattern layers 53A and 53B and the second conductive pattern layers 54A.

Figure 10A:
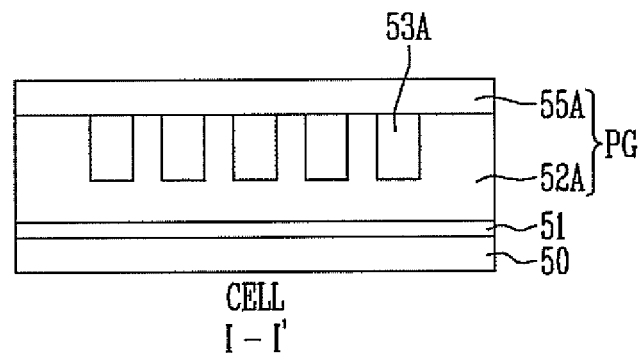
Figure 10B:
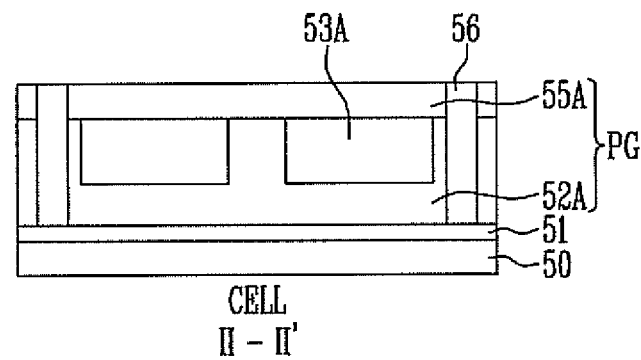
Figure 10C:
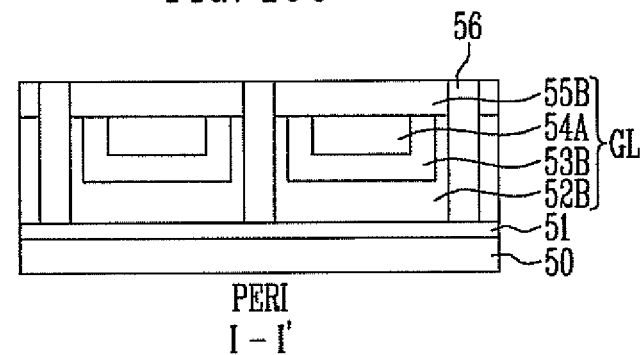

As shown in FIGS. 10A to 10C, the third conductive layer 55 and the first conductive layer 52 may be etched. As a result, the pipe gate PG may be formed of a first conductive layer 52A, the barrier pattern layers 53A, and a third conductive layer 55A in the cell region. The gate line GL may be formed of a first conductive layer 52B, the barrier pattern layer 53B, a second conductive pattern layer 54A, and a third conductive layer 55B in the peripheral region.

Subsequently, regions removed by etching the third conductive layer 55 and the first conductive layer 52 may be filled with insulating layers 56.

Subsequently, though not shown in FIGS. 10A to 10C, processes of forming memory cells in the cell region may be performed.

Figure 11:
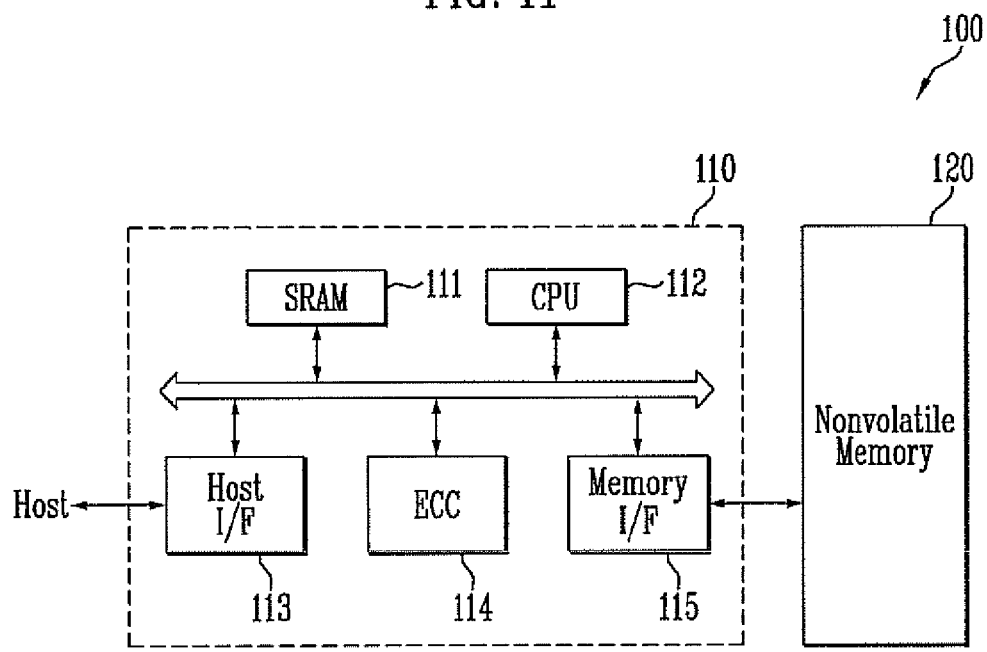
FIG. 11 is a block diagram illustrating a memory system according to an embodiment of the present invention.

FIG. 11 is a view illustrating the configuration of a memory system.

As shown in FIG. 11, a memory system 100 according to an embodiment of the present invention includes a non-volatile memory device 120 and a memory controller 110.

The non-volatile memory device 120 includes the gate lines described according to the first to eighth embodiments. In addition, the non-volatile memory device 120 may be a multi-chip package composed of a plurality of flash memory chips.

The memory controller 110 is configured to control the non-volatile memory device 120. The memory controller 110 may include SRAM 111, a CPU 112, a host interface 113, an ECC 114, and a memory interface 115. The SRAM 111 is used as an operation memory of the CPU 112. The CPU 112 performs the general control operation for data exchange of the memory controller 110. The host interface 113 includes a data exchange protocol of a host being coupled to the memory system 100. In addition, the ECC 114 detects and corrects errors included in data read from the non-volatile memory device 120. The memory interface 115 performs to interface with the non-volatile memory device 120. The memory controller 110 may further include RCM that stores code data to interface with the host.

The memory system 100 having the above-described configuration may be a solid state disk (SSD) or a memory card, which includes the memory device 120 and the memory controller 110. For example, when the memory system 100 is an SSD, the memory controller 110 may communicate with the outside (e.g., a host) through one of the interface protocols including USB, MMC, PCI-E, SATA, PATA, SCSI, ESDI, and IDE.

Figure 12:
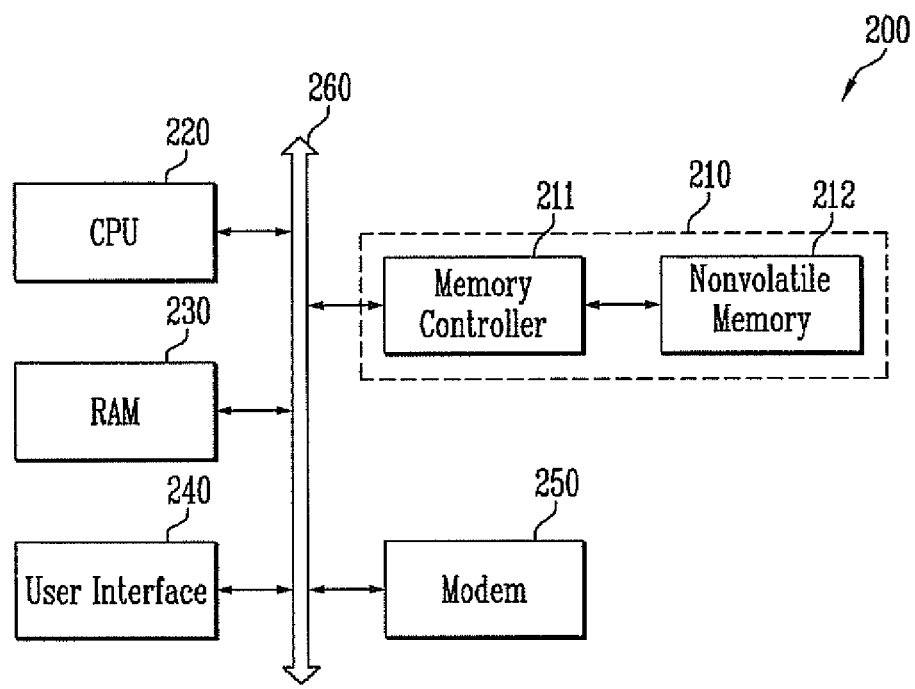
FIG. 12 is a block diagram illustrating a computing system according to an embodiment of the present invention.

FIG. 12 is a view illustrating the configuration of a computing system according to an embodiment of the present invention.

As shown in FIG. 12, a computing system 200 according to an embodiment of the present invention may include a CPU 220, RAM 230, a user interface 240, a modem 250, and a memory system 210 that are electrically coupled to a system bus 260. In addition, when the computing system 200 is a mobile device, a battery may be further included to apply an operating voltage to the computing system 200. The computing system 200 may further include application chipsets, a Camera Image Processor (CIS), and mobile DRAM.

As described above with reference to FIG. 11, wherein the memory system 210 may include a nonvolatile memory 212 and a memory controller 211.

In the specification of the present invention, a method of forming a gate line of a 3-D non-volatile memory device is described for illustration purposes. However, the present invention is not limited thereto. The present invention may be applied to any semiconductor device including a volatile memory device such as DRAM as well as a non-volatile memory device, if the semiconductor device includes a gate line.

A gate line of a semiconductor device may include a first conductive layer and at least one second conductive pattern layer formed in the first conductive layer. In particular, the second conductive pattern layer may comprise a metal layer to thus reduce resistance of the gate line.

What is claimed is:

1. A semiconductor device, comprising:
   a substrate; and
   a gate line, formed over the substrate, which includes a first conductive layer, one or more second conductive pattern layers located in the first conductive layer, and a third conductive layer formed over the first conductive layer, wherein the first conductive layer and the third conductive layer include the same type of impurities or different types of impurities.

2. The semiconductor device of claim 1, wherein the gate line further includes a barrier pattern layer contacting a bottom surface and side surfaces of the second conductive pattern layer.

3. The semiconductor device of claim 1, wherein the second conductive pattern layer comprises a metal layer, and the first conductive layer comprises a polysilicon layer.

4. The semiconductor device of claim 1, wherein the first conductive layer contacts a bottom surface and side surfaces of the second conductive pattern layer and the third conductive layer contacts a top surface of the second conductive pattern layer.

5. A semiconductor device, comprising:
   a substrate; and
   a gate line, formed over the substrate, which includes a first conductive layer, one or more second conductive pattern layers located in the first conductive layer, and a third conductive layer formed over the first conductive layer, wherein the first conductive layer comprises:
   a lower conductive layer including a first type of impurities; and
   an upper conductive layer including a second type of impurities different from the first type of impurities.

6. The semiconductor device of claim 1, wherein the second conductive pattern layer includes at least one line pattern extending in one direction.

7. The semiconductor device of claim 1, wherein the second conductive pattern layer comprises:
   line patterns extending in one direction; and
   island patterns located between the line patterns and coupling neighboring line patterns.

8. The semiconductor device of claim 1, wherein the second conductive pattern layer includes at least one island pattern.

9. A semiconductor device, comprising:
   a substrate;

a gate line, formed over the substrate, which includes a first conductive layer and one or more second conductive pattern layers located in the first conductive layer;

a pipe gate formed in a cell region of the substrate and formed of the first conductive layer; and a pipe channel layer formed in the pipe gate.

10. The semiconductor device of claim 9, wherein the pipe gate comprises:

the first conductive layer contacting a bottom surface and side surfaces of the pipe channel layer; and a third conductive layer formed over the first conductive layer and contacting a top surface of the pipe channel layer.

11. The semiconductor device of claim 10, wherein the first conductive layer and the third conductive layer include the same type of impurities or different types of impurities.

12. The semiconductor device of claim 9, wherein the gate line further includes a barrier pattern layer contacting a bottom surface and side surfaces of the second conductive pattern layer.

13. The semiconductor device of claim 9, wherein the second conductive pattern layer comprises a metal layer, and the first conductive layer comprises a polysilicon layer.

14. The semiconductor device of claim 9, wherein the first conductive layer comprises:

a lower conductive layer including a first type of impurities; and an upper conductive layer including a second type of impurities different from the first type of impurities.

15. The semiconductor device of claim 9, wherein the second conductive pattern layer includes at least one line pattern extending in one direction.

16. The semiconductor device of claim 9, wherein the second conductive pattern layer comprises:

line patterns extending in one direction; and island patterns located between the line patterns and coupling neighboring line patterns.

17. The semiconductor device of claim 9, wherein the second conductive pattern layer includes at least one island pattern.

18. A semiconductor device, comprising:

a pipe gate, located in a cell region, including a first conductive layer;

a pipe channel layer formed in the pipe gate; and a gate line, located in a peripheral region, including the first conductive layer and one or more second conductive pattern layers located in the first conductive layer.

19. The semiconductor device of claim 18, wherein the gate line comprises:

the first conductive layer contacting a bottom surface and side surfaces of the second conductive pattern layer; and a third conductive layer formed over the first conductive layer and contacting a top surface of the second conductive pattern layer.

* * * * *